United States Patent
Southern et al.

(10) Patent No.: US 10,235,213 B2
(45) Date of Patent: Mar. 19, 2019

(54) PROCESS MIGRATION METHOD, COMPUTER SYSTEM AND COMPUTER PROGRAM

(71) Applicant: FUJITSU LIMITED, Kawasaki-shi, Kanagawa (JP)

(72) Inventors: James Alastair Southern, Reading (GB); Peter Chow, Gillingham Kent (GB)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/809,595

(22) Filed: Jul. 27, 2015

(65) Prior Publication Data

US 2015/0331721 A1 Nov. 19, 2015

Related U.S. Application Data

(63) Continuation of application No. PCT/EP2014/050963, filed on Jan. 17, 2014.

(30) Foreign Application Priority Data

Jan. 28, 2013 (EP) .................................... 13152927

(51) Int. Cl.
G06F 9/50 (2006.01)
G06F 17/50 (2006.01)
(Continued)

(52) U.S. Cl.
CPC .......... *G06F 9/5083* (2013.01); *G06F 9/4856* (2013.01); *G06F 9/5016* (2013.01);
(Continued)

(58) Field of Classification Search
CPC .... G06F 9/5083; G06F 9/5088; G06F 9/5016; G06F 9/4856; G06F 17/30575; G06F 17/5009

See application file for complete search history.

(56) References Cited

U.S. PATENT DOCUMENTS

2003/0187915 A1 10/2003 Sun et al.
2008/0077921 A1* 3/2008 Chaudhary ............... G06F 9/52
718/100

(Continued)

FOREIGN PATENT DOCUMENTS

| JP | 2000-235551 | 8/2000 |
|---|---|---|
| JP | 2000-250771 | 9/2000 |
| JP | 2013-69189 | 4/2013 |

OTHER PUBLICATIONS

Florian Fleissner et al: "Parallel load-balanced simulation for short-range interaction particle methods with hierarchical particle grouping based on orthogonal recursive bisection", International Journal for Numerical Methods in Engineering, vol. 74, No. 4, Apr. 23, 2008, pp. 531-553.

(Continued)

*Primary Examiner* — Jacob D Dascomb
(74) *Attorney, Agent, or Firm* — Staas & Halsey LLP

(57) ABSTRACT

A process migration method comprising executing a computer program using a group of parallel processes, each process carrying out a computation, the execution using current computing resources to provide current group data as a result of the computations, deciding to change the resources, and making a choice between increasing the resources; decreasing the resources; and moving to different resources, wherein moving to different resources can include increase, decrease or maintenance of the resources. The method comprising communication between the current computing resources and changed computing resources to allow the program to execute on the changed resources, the communication comprising migration of the execution to changed resources and synchronization of migrated group (Continued)

data with the current group data; wherein execution using the current resources overlaps in time with the communication.

14 Claims, 10 Drawing Sheets

(51) Int. Cl.
  *G06F 17/30* (2006.01)
  *G06F 9/48* (2006.01)
(52) U.S. Cl.
  CPC ...... *G06F 9/5088* (2013.01); *G06F 17/30575* (2013.01); *G06F 17/5009* (2013.01)

(56) References Cited

U.S. PATENT DOCUMENTS

| | | | |
|---|---|---|---|
| 2008/0222638 A1 | 9/2008 | Beaty et al. | |
| 2009/0089787 A1 | 4/2009 | Giles et al. | |
| 2009/0276783 A1* | 11/2009 | Johnson | G06F 9/5077 718/104 |
| 2010/0251235 A1* | 9/2010 | Ganguly | G06F 9/45558 718/1 |
| 2011/0004574 A1 | 1/2011 | Jeong et al. | |
| 2011/0099553 A1 | 4/2011 | Agarwal et al. | |
| 2011/0265088 A1 | 10/2011 | Devadhar et al. | |
| 2011/0289507 A1 | 11/2011 | Khan et al. | |
| 2012/0011391 A1 | 1/2012 | Callaway et al. | |
| 2014/0067758 A1* | 3/2014 | Boldyrev | H04L 67/1097 707/610 |

OTHER PUBLICATIONS

Clark C et al: "Live migration of virtual machines", Proceedings of the Symposium on Networked Systems Design Andimplementation, Jan. 1, 2005 (Jan. 1, 2005), pp. 273-286.
Extended European Search Report dated Jul. 1, 2013 in corresponding European Application No. 13152927.3.
International Search Report dated May 2, 2014 in International Application No. PCT/EP2014/050963.
Marc H. Willebeek-LeMair, et al, "Strategies for Dynamic Load Balancing on Highly Parallel Computers," IEEE Transactions on Parallel and Distributed Systems, vol. 4, No. 9, Sep. 1993, pp. 979-993.
Chao Wang, et al., "Proactive Process-Level Live Migration in HPC Environments", 1993, pp. 1-12.
Japanese Office Action dated Apr. 3, 2018 in corresponding Japanese Patent Application No. 2015-554112, 7 pages.
Japanese Office Action dated Jan. 23, 2018 in corresponding Japanese Patent Application No. 2015-554112, 12 pages.

* cited by examiner

PROCESS MIGRATION METHOD, COMPUTER SYSTEM AND COMPUTER PROGRAM

CROSS-REFERENCE TO RELATED APPLICATIONS

This application is a continuation of International Application No. PCT/EP2014/050963, filed Jan. 17, 2014, which claims the benefit of European Application No. 13152927.3, filed Jan. 28, 2013, the disclosures of all of which are incorporated herein by reference.

BACKGROUND

1. Field

The present invention relates to migration of computing processes, in particular to when the processes are running in parallel on a distributed computing system with distributed memory.

2. Description of the Related Art

The invention has practical applications in particular in the area of computer programs which use distributed memory and exchange information dynamically. Many of these programs use distributed processing and memory which is divided to correspond to individual elements, for which some form of computation is required.

One example of such a distributed parallel application is a computer program monitoring a sensor network, or a communications network. Each sensor in a sensor network can be viewed as an individual element requiring computation, for instance to process sensed values and/or to determine characteristics such as overall processing load. The computations can be carried out by a computing program which monitors the sensor network, and can also control the sensor network.

In a communications network, each entity (such as a mobile terminal or user equipment (UE), base station or relay station) can also be viewed as an element requiring computation, for example to determine an overall load. The computations can be carried out by a computing program which monitors and/or controls the communications network.

A further example is in monitoring stock trading, for instance to analyse the data for illegal trading practices. Computation may be required to track the transactions of each trader.

A yet further example is simulation. In many simulations, an iterative computation or iterative sets of computations are carried out, each computation corresponding to a single element in the simulation. Simulation elements may be linked in that a computation for one element of the simulation may require values from other elements of the simulation, so that data transfer between processes carrying out the simulation is considerable. Computer programs carrying out such simulations require the workload associated with the computations to be allocated to suitable computing resource, for example within a distributed system.

In these computer programs and other computer programs with linked computations, there may be a requirement to migrate processes. For example, it may be necessary to move the entire execution to a new computer system or new part of a computer system to allow for changes in resource utilization by the computer program itself or by other computer programs. For example, in a sensor network, an emergency event (such as an earthquake) may lead to a sudden requirement for more resource to allow quicker processing. In telecommunications, the conditions during peak periods and off-peak periods of usage might be better monitored using different systems. Also, data input for trading analysis, or trading monitoring, must be updated instantaneously (or at least within a short time frame). A surge in trading may require the use of extra resources.

Execution of the computer program itself may require a change in resource within the same system, for instance due to development of factors within the program or to external considerations.

As mentioned previously, there are many computer programs with individual elements requiring individual computation, some also having potential effect on other elements of the simulation. Two examples requiring a high level of communication between elements are use of finite element and finite volume methods to simulate material characteristics, including those of both fluids and solids.

Taking computational fluid dynamics (CFD) as an example, this technique uses numerical methods and algorithms to solve and analyze problems that involve fluid flows. There are many approaches to CFD modeling and other three-dimensional algorithmic modeling, but the same basic three-stage procedure is almost always followed.

During pre-processing, the geometry (physical bounds) of the problem is defined; and the volume occupied by the fluid or other material is divided into discrete cells or nodes (the mesh). The mesh may be uniform or non uniform and its division into cells or nodes may be adaptive, to change the mesh size as appropriate during simulation. The physical modeling is defined using appropriate equations and boundary conditions are defined. In CFD this involves specifying the fluid behavior and properties at the boundaries of the problem. For transient problems, the initial conditions are also defined.

In processing the simulation is started and the equations are solved iteratively on a pe-cell/per-node basis, as a steady-state or transient.

Finally a postprocessor is used for the analysis and visualization of the resulting solution.

The data for each mesh node or discrete cell can be viewed as a single element in the simulation.

Another example of a computer simulation is agent modeling (also referred to as agent-based modeling) in which individuals can be viewed as elements of a simulation.

An agent-based model (ABM) (also sometimes related to the term multi-agent system or multi-agent simulation) is a computational model for simulating the actions and interactions of autonomous agents with a view to assessing their effects on the system as a whole. In many models, each agent is an individual (person, animal or other autonomous element). In order to simulate the individual's behavior, the individual is given attributes, such as a moveable position and rule-based reactions to stimuli, including other individuals.

A further example of simulation is particle simulation, which simulates a dynamic system of particles, usually under the influence of physical forces such as gravity. Each particle may be viewed as a single element in such a simulation.

Computationally intense applications like these are often carried out on high performance computer systems. Such high performance computer (HPC) systems often provide distributed environments in which there is a plurality of processing units or cores on which processing threads of an executable can run autonomously in parallel.

Many different hardware configurations and programming models are applicable to high performance computing.

A popular approach to high-performance computing currently is the cluster system, in which a plurality of nodes each having one or more multicore processors (or "chips") are interconnected by a high-speed network. Each core is assumed to have its own area of memory. The cluster system can be programmed by a human programmer who writes source code, making use of existing code libraries to carry out generic functions. The source code is then compiled to lower-level executable code, for example code at the ISA (Instruction Set Architecture) level capable of being executed by processor types having a specific instruction set, or to assembly language dedicated to a specific processor. There is often a final stage of assembling or (in the case of a virtual machine, interpreting) the assembly code into executable machine code. The executable form of an application (sometimes simply referred to as an "executable") is run under supervision of an operating system (OS).

Applications for computer systems having multiple cores may be written in a conventional computer language (such as C/C++ or Fortran), augmented by libraries for allowing the programmer to take advantage of the parallel processing abilities of the multiple cores. In this regard, it is usual to refer to "processes" being run on the cores.

In cluster systems and in other distributed memory system, migration of an execution can require synchronization of data.

To assist understanding of the invention to be described, some relevant considerations are set out below, using simulation as an example.

A "fixed number of processors" model assumes that the workload to be distributed, the priority of the job (i.e. how urgently the results are required) and the system on which the job is running will remain constant over the duration of the simulation. However, this may not be the case.

In the example of an adaptive finite element simulation, the number of mesh nodes in the simulation may vary by one or more orders of magnitude over the course of the simulation. During the simulation, the mesh may be partitioned so that the data relating to different nodes are stored in memory associated with different processors. The processor "owns" the nodes whose data are primarily stored in its local memory. Nodes from which data is required for computation of values for any particular owned node are known as "halo nodes" to that processor.

When the number of mesh nodes varies, the number of mesh nodes allocated to each processor of a distributed system may become very low compared to the number of halo nodes per processor at some stage of the simulation. This can lead to a very high communication-to-computation ratio because data from the halo nodes is required for simulation of the mesh nodes. In this case, it may become faster to run the simulation on a smaller number of processors (reducing the communication).

Alternatively, changed priorities may make it desirable to allocate extra resources to a given job on the HPC system or move the job to an entirely new system. For example, a real-time disaster warning system may be running as a monitoring network or as a simulation at low priority on a small subset of the available resources when a sudden event—e.g. an earthquake—perturbs the system that it is simulating, requiring rapid monitoring or simulation of the consequences using as many resources as can be made available. Simultaneously, other jobs must be scaled down to smaller systems in order to make way for the high priority job.

Further, a response to a failure in one of n processors allocated to a job might be to migrate the execution to run on (n−1) processors (rather than terminating the job entirely).

It is therefore desirable to provide a way of migrating execution of a computer program that can be used flexibly for different circumstances and that takes into account the difficulty of migration and synchronization.

SUMMARY

Additional aspects and/or advantages will be set forth in part in the description which follows and, in part, will be apparent from the description, or may be learned by practice of the invention.

According to an embodiment of the first aspect of the present invention there is provided a process migration method comprising executing a computer program using a group of parallel processes, each parallel process carrying out at least one computation, the execution using current computing resources to provide current group data as a result of all the computations, deciding to change the resources used, and making a choice between increasing the resources used; decreasing the resources used; and moving to different resources, wherein moving to different resources can include increase, decrease or maintenance of the resources used; the method further comprising communication between the current computing resources and changed computing resources to allow the computer program to execute on the changed computing resources, the communication comprising migration of the execution to changed computing resources and synchronization of migrated group data with the current group data; wherein execution using the current computing resources overlaps in time with the communication.

Thus this embodiment of the invention allows an efficient process migration method in that the communication steps allowing the migration to take place at least partly in parallel with execution on the current computing resources.

The communication between the current computing resources and the changed computer resources comprises migration of the execution to changed computer resources and synchronization of migrated group data with current group data (group data is effectively data in memory belonging to all the processes in the group of parallel processes). Either or both of these communication procedures can overlap with execution in the current resources.

Overlapping of these procedures with execution is highly advantageous because there should be as little interruption as possible to the progress of the computer program when it is migrated to new resources. This is particularly important on a distributed memory system (or when the simulation is moved from one system to another) since the data movement can take a significant amount of time. This time taken to move the data is in fact a consequence of the complexity involved in using a distributed system. That is, it includes the time take to work out where the data needs to be sent.

Currently migration and synchronization is a time-consuming process: the current execution must be stopped and the data from each process consolidated in one location and written to file (checkpointing). A new execution is then started from the checkpointed data, resulting in a delay while the data is consolidated, the output files are written, the execution resubmitted via the queuing system and the output files read back in to initiate the execution. This is dead time that cannot be recovered once the execution is re-started. (Note: rather than consolidating data, it is possible for each process to write an individual checkpoint file—however, it will still be necessary to transmit the data from the old resources to the new, and unless the number of processes is the same before and after migration, communication between processes will be needed to allocate the data appropriately on the new resources.)

In other prior-art scenarios, it may be possible to migrate an application or move one process, but there is no flexibility about the extent or type of change in resources.

Invention embodiments propose a method for efficiently synchronizing the data between processes following migration, by overlapping computation and communication. This allows automatic, on-the-fly migration and synchronization of the computer program, with a choice between resource increase/decrease and/or transfer to a new system, which may be accompanied by an increase or decrease in resource. The new method of invention embodiments represents an improvement on the checkpoint-and-restart method generally employed (which requires the execution to stop altogether during migration and synchronization) and more flexibility than previous on-the-fly methods.

Invention embodiments allow increased computing resources to be brought on stream or removed from use more quickly than is currently possible. Thus for example any application for which a surge in information requires immediate processing that cannot be handled by current resources may benefit from the invention. Equally, efficient use of computing resources can be furthered by the invention, because when there is a drop in processing requirement of one program, computing resources can be efficiently freed for use by other programs.

After the communication phase, the execution can resume on the changed resources, so that the execution switches from the current resources to the changed resources.

The relationship between the current computing resources and the changed computing resources in the invention embodiments may be any suitable relationship. For example the changed resources may be a sub-set or a super-set of the current resources, or the changed resources may be completely new resources (for example of a different computer system) with a capacity the same as, more or less than the current computing resources.

There are three particular cases of interest in which the method is applied: increasing the available number of processes (for example on the same system), decreasing the available number of processes (for example on the same system) and migrating to a different system (possibly with an increase or decrease in the resources used, for example a migration to a system of a different size). All of these migrations can be automatic, (in which case it is assumed that there is no need for user intervention—for instance by logging on to the new system) even if migration is to a different system.

The method of invention embodiments is useful for all of these different migration scenarios and includes a choice between the scenarios (which may be included as part of the decision to change the resources used). The decision and choice may be made automatically, for example, according to changing resource requirements of the computer program or of other computer programs. Thus a job scheduler could make the decision and/or choice according to pre-defined rules. Alternatively user input may be provided to influence or determine the choice, for instance by prioritizing one job in a system over others. Thus the method includes choosing between increasing the resources used, decreasing the resources used and moving to different resources (in which case resources can be increased or decreased at the same time). Optionally the choice is made according to the resource requirements of the computer program.

The method of invention embodiments is preferably applied in a distributed memory system. Each process may use individual current resources including a single processing unit executing the computation and a single region of memory to store current process data for the computation. For example, each process may include one iterative computation (for example corresponding to one mesh node of a simulation) or it may include more than one computation (for example so that each process carries out linked computations for more than one mesh node of a simulation).

In any case, in the distributed memory system it can be important to avoid spreading computations over more than one processing unit (for example over more than one node in a distributed system) because the amount of communication required between a set of linked communications is high.

Depending on the computer system used, the processing unit may be any individual processing unit, for example a node or a processor or a core of a multi-core processor.

In invention embodiments communication involves both migration and synchronization. Migration is preferably the first step in the communication and optionally includes communication of partition data that indicates the allocation of computations to processes. The partition data is preferably sent from the current resources to the changed resources. For instance, the entire partition data is sent, with the relevant part sent to each processing unit within the changed resources. Once the current partition data has been received, the processes must be divided among the changed resources. There may also be a re-division of computations between processes (repartitioning) before or after receipt of the partition data (although this repartitioning does not take place if there is migration to a new system, but no change in the amount of resource available. Both these steps can overlap with computation in the current resources.

In some embodiments new partition data indicating the changed allocation of computations to (new) processes is calculated. The mapping of new processes to changed resources may then be made.

Preferably, synchronization follows migration/re-partitioning. Synchronization can include any communication that provides synchronization between processes. It could be communication of time-dependent process data, for example relating to the migrated computations, the communication taking place between the current resources and the changed resources.

Initialization can comprise setting up the new resources after migration and synchronisation, so that the processes can continue on the changed resources Initialisation/set-up may includes, for example, setting up required data structures in memory, and calculating the values of any dependent variables that are not directly communicated.

According to invention embodiments, synchronization is required between migrated group data and current group data. The synchronization may not be of all the migrated and current data. For example if only a small percentage of processes is divided to give more detail in one area of a simulation, synchronization may take into account only the area which is being modeled in more detail and potentially a limited area around the area. Synchronization is carried out as required.

Preferably synchronization includes communication of state data, which may take any form required by the computer program or application. The term "state data" refers to the time variable data held by the application in memory for each process. For a mesh-based simulation it could be the values of each variable at each mesh point "owned" by a particular process (responsible for a particular process). For a particle-based simulation it could be the current locations and velocities of each owned particle.

The synchronization can be carried out as part of the computer program or as an external process. If the computer program includes synchronization functionality, this functionality may be associated with the computations so that synchronization is carried out at the end of one instance of all the computations.

In invention embodiments, the computations may be iterations of an equation solver running in a loop, and synchronization may be carried out at the end of one loop. Optionally, synchronization includes running computations for the next loop in both the current computing resources and the changed computing resources, with comparison of the results. Alternatively, if current resources are no longer to be used, it may be sufficient to re-start the execution in the changed resources with received state data corresponding to a synchronized position in the iterative computation/simulation loops.

The computations may each correspond to a single element or a group of elements in the computer program, such as sensors or nodes in a sensor network, or entities in a communications network. As mentioned previously, one of the preferred computer program types used in progress migration methods of invention embodiments is a simulation program. Thus each element may correspond to a collection of mesh node of a mesh simulation, one or more agents of an agent simulation or one or more particles of a particle simulation.

Moving the execution may simply move the processes to new resources without change to the allocation of computations to processes. However, in other embodiments, the allocation of computations between processes may be changed. Thus if a process previously included two linked, iterative computations, one of these may be moved to a different process during migration. Conversely, a process which previously contained a single computation only might be amalgamated with another process during migration to form a single process with two or more linked computations. As a further example, execution of an entire computer program may be moved to a new system and resource increased or decreased at the same time.

Selection between increasing and decreasing the number of processes may be made according to whether computing resource requirements of the computer program have increased or decreased.

Alternatively or additionally, the overall number of computations in the executable may be changed (for example to add or remove elements), thus changing the number of processes. For example, in simulation, more detail may be required for a part of a simulation, involving production of a finer mesh at that position.

Thus, migration may increase or decrease the number of processes by altering the number of computations and/or the division of computations into processes.

Selection between increasing and decreasing the number of processes can be made according to whether computing resource requirements of the computer program have increased or decreased. Alternatively user may specify the number of processes on which the computer program runs, both at the start of the execution and/or for the migration.

Embodiments of a second aspect of the invention provide a computer system configured to carry out process migration, the system comprising distributed processing and memory configured to execute a computer program in a group of parallel processes, each parallel process carrying out a computation using current processing units and associated current memory; a controller configured to decide whether to change the resources used, and to make a choice between increasing the resources used; decreasing the resources used; and moving to different resources, wherein moving to different resources can include increase, decrease or maintenance of the resources used; and an interconnect configured to provide communication between the current processing units and associated current memory regions and changed processing units and associated changed memory regions, the interconnect allowing communication so that the computer program can execute on the changed processing units and associated changed memory regions; wherein the interconnect is configured for communication in a time span that overlaps with execution using the current processing units and associated current memory region.

The computer system may further include other components such as a graphical user interface GUI for the user to input data such as the number of processes required (or data from which the number of processes may be calculated) and output means, for example in the form of a screen for visualization of the results and/or a printer to provide printed results.

According to a further aspect there is provided a program which when loaded onto a computing apparatus such as a distributed memory computer system configures the computing apparatus to carry out the method steps according to any of the preceding method definitions or any combination thereof.

Features and sub features of any of the different aspects of the invention may be freely combined. For example, preferred embodiments of the computer system may be configured to incorporate functionality corresponding to one or more preferred features of the method.

The invention can be implemented in computer hardware, firmware, software, or in combinations of them. The invention can be implemented as a computer program or computer program product, i.e., a computer program tangibly embodied in an information carrier, e.g., in a machine-readable storage device or in a propagated signal, for execution by, or to control the operation of, one or more hardware modules.

A computer program can be in the form of a computer program portion or more than one computer program and can be written in any form of programming language, including compiled or interpreted languages, and it can be deployed in any form, including as a stand-alone program or as a module, component, subroutine, or other unit suitable for use in a data processing environment. A computer program can be deployed to be executed on one module or on multiple modules at one site or distributed across multiple sites and interconnected by a communication network.

Method steps of the invention can be performed by one or more programmable processors executing a computer program to perform functions of the invention by operating on input data and generating output. Each processor may have one or more cores.

Processors suitable for the execution of a computer program include, by way of example, both general and special purpose microprocessors, and any one or more processors of any kind of digital or biological computer. Generally, a processor will receive instructions and data from a read-only memory or a random access memory or both. The essential elements of a computer are a processor for executing instructions coupled to one or more memory devices for storing instructions and data.

The invention is described in terms of particular embodiments. Other embodiments are within the scope of the following claims. For example, the steps of the invention can be performed in a different order and still achieve desirable results.

The apparatus according to preferred embodiments is described as configured, operable or arranged to carry out certain functions. This configuration or arrangement could be by use of hardware or middleware or any other suitable system. In preferred embodiments, the configuration or arrangement is by software.

BRIEF DESCRIPTION OF THE DRAWINGS

These and/or other aspects and advantages will become apparent and more readily appreciated from the following description of the embodiments, taken in conjunction with the accompanying drawings of which.

DETAILED DESCRIPTION

Figure 1:
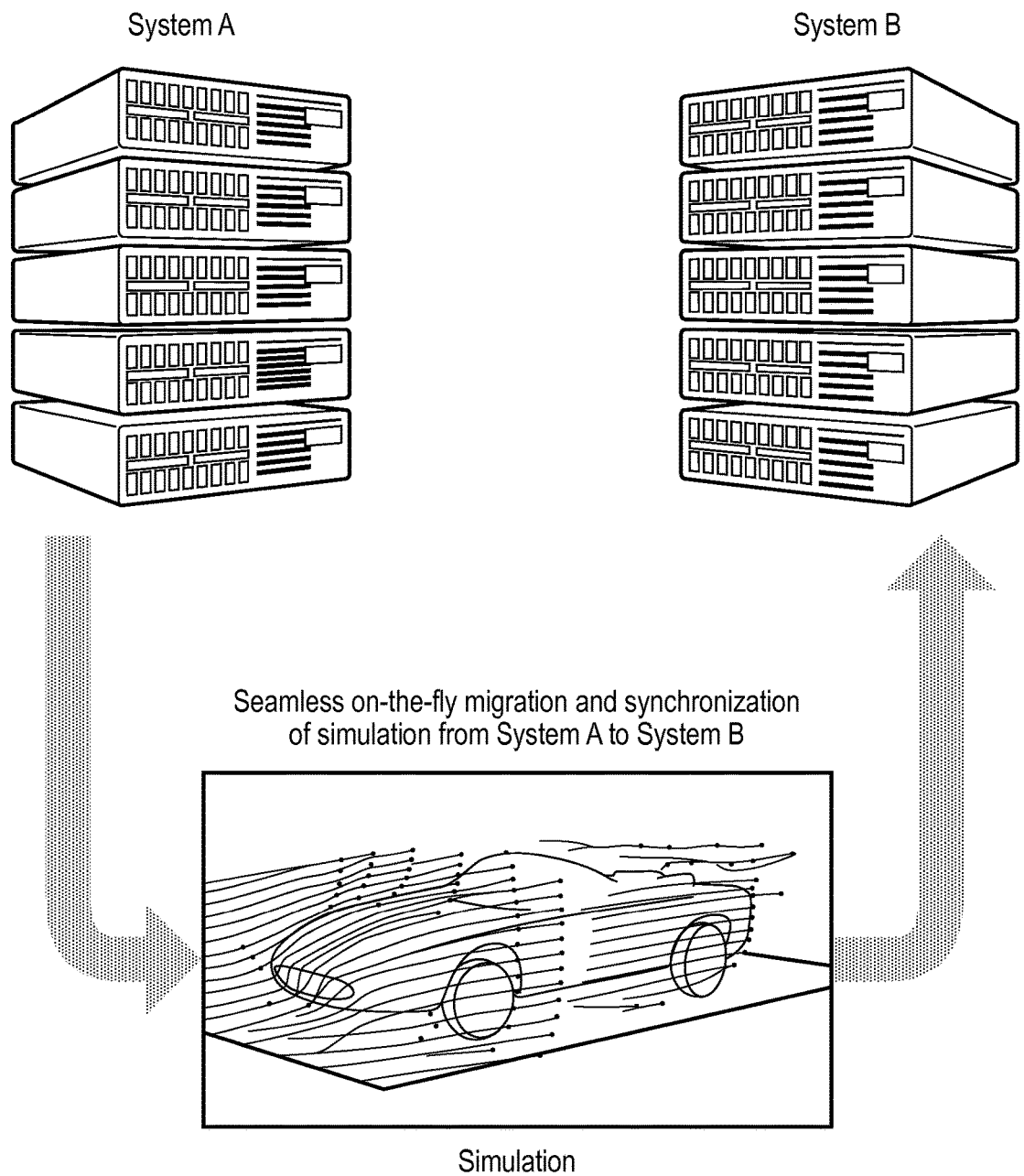
FIG. 1 is an overview diagram of on-the-fly migration.

Reference will now be made in detail to the embodiments, examples of which are illustrated in the accompanying drawings, wherein like reference numerals refer to the like elements throughout. The embodiments are described below to explain the present invention by referring to the figures.

Preferred embodiments of the invention manage the synchronization of data during the process of moving a running simulation between two different systems or between a different number of processors on the same system. Thus the application finds many applications in the field of high-performance computing, in particular in job scheduling and management.

FIG. 1 is an overview diagram showing how embodiments of the invention can move a simulation of airflow over a vehicle from execution on system A to execution on system B. The movement is referred to as seamless on-the-fly migration and synchronization. Thus it is not necessary to completely stop the simulation process in order to migrate it from system A to system B.

The inventors have identified that the main technical issues in moving such a simulation to a different number of processes can include re-partitioning the simulation (i.e. determining which data is located on which process), moving data around to reflect the new partition and synchronizing the simulation following the migration so that the simulation can continue. They have come to the conclusion that ideally these steps should be overlapped to some extent with the simulation itself so that there is as little interruption as possible to the progress of the simulation. This is particularly important on a distributed memory system (or when the simulation is being moved from one system to another) since the data movement can take a significant amount of time.

Figure 2:
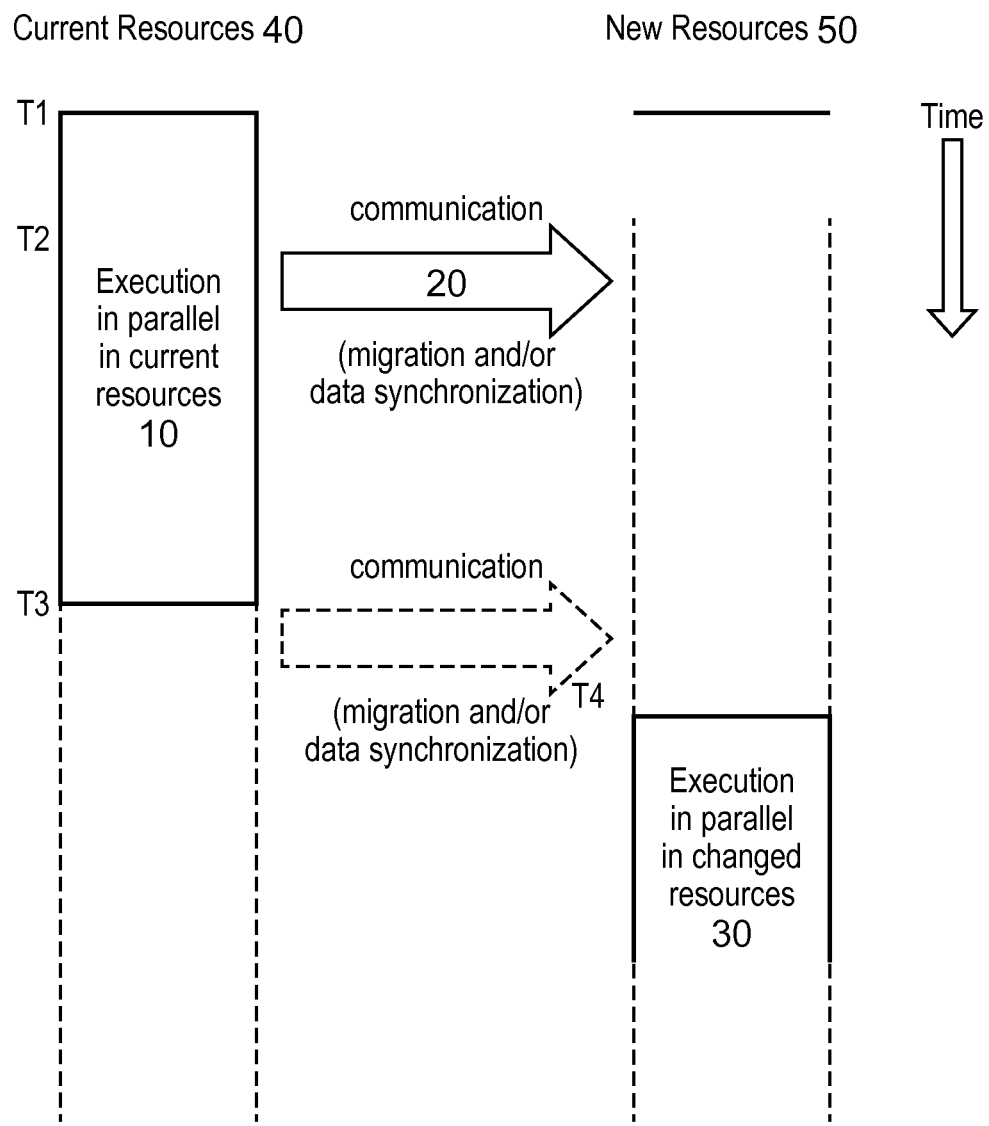
FIG. 2 is a schematic diagram of how execution can overlap with communication.

FIG. 2 is a time-based schematic diagram showing the movement of execution of an application from current resources to changed resources. At time T1 execution is in the current resources and at time T2 communication starts to the new resources. At time T3 execution in the current resources stops and depending on the circumstances, there may be further communication (shown as a dashed arrow) between the current resources and the new resources before execution re-starts in the changed resources. Communication is shown in the direction from the current to the new resources, but in many practical scenarios there will be two-way communication. For example, notification of new resource allocation and requests can be sent from the new resources to the current resources.

The communication arrows shown communication occurring at time point T2 only but the skilled reader would appreciate that the communication can continue between time T2 and time T4, perhaps with one or more breaks.

There are three particular cases of interest in which the method of invention embodiments may be applied: increasing the available number of processes (for example on the same system), decreasing the available number of processes (for example on the same system) and migrating to a different system.

In any of these situations it is envisaged that for most of its duration the execution is behaving in a loop fashion, with a similar workflow in each pass through the loop (e.g. time-stepping or iterations in a (non-)linear solver). Migration and synchronization take place at the end of a loop. The synchronization process can be automated (flow charts showing implementation details are presented in the following). The automation could either be embedded within the equation solver or take the form of a wrapper that is able to control the behavior of the solver, but is not necessary a part of it.

Figure 3:
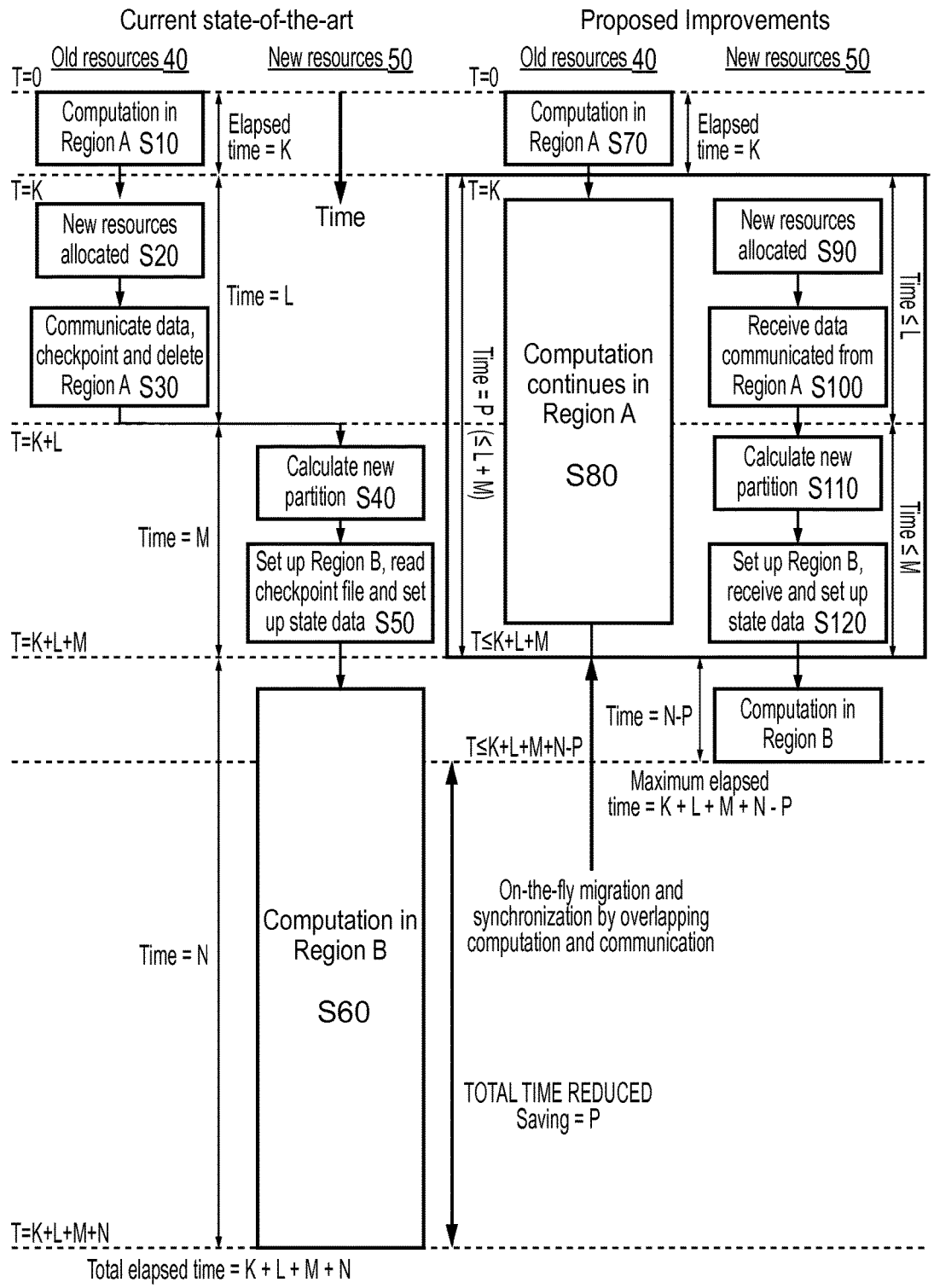
FIG. 3 is a time comparison of invention embodiments with the prior art.

A general overview of the algorithm of invention embodiments is shown in FIG. 3 (with timings approximately to scale). The novel steps compared to the current state-of-the-art are in the shaded box. These novel steps are overlapping communication and computation, that is, continuing computation during migration and synchronization. It can be seen that, as a result of overlapping the communication and computation, the method of invention embodiments must be at least as fast as the current state-of-the-art.

FIG. 3 compares the current state of the art process with an invention embodiment. In both cases calculation is transferred between old resources and new resources. Computation starts in region A at time T=0 in step S10. After a lapsed time K at T=K the migration starts.

Considering the state-of-the-art procedure first, new resources are allocated in step S20 and data is communicated with a checkpoint procedure and deletion of region A in step S30. This checkpointing involves consolidating data from each process in one location and writing it to file. At time T=K+L the data is transferred to the new resources and a new partition is calculated, S40. This new partition allows mapping of processes to individual new resources in region B. The reader will appreciate that regions A and B may be part of the same system or even overlapping regions. There may also be parts of different systems. After the new partition is computed in step S40, region B is set up by mapping processes onto individual resources, the checkpoint file is read and the state data for the new region is set up (step S50). These tasks take up time M and thus in order for the execution to restart time T=K+L+M has passed. Calculation in region B takes up time N and a final elapsed time T=K+L+M+N.

In contrast, according to the invention embodiment execution starts at time T=0 for a lapsed time K (S70) and then there is overlap of execution in region A with steps for communication between region A and region B allowing the computer program to execute in region B. Thus, while computation continues in region A in step S80, in region B initially new resources are allocated in step S90. Subsequently data is received from region A in step S100. The time taken for this should be less than or equal to time L for corresponding steps in the state of the art, because there is no checkpoint procedure. Subsequently the new partition is calculated in step S110 and region B is set up and state data is received and set up in step S120. Time for these steps should take less than or equal to M (the time for the equivalent stage in the state of the art because state of the art procedure additionally includes reading of a checkpoint file).

Thus the block of time in which calculation continues in region A and there is parallel migration and then synchronization takes time $T=P\leq(L+M)$. Calculation continues in region B at this time and a total time saved is calculated as P.

In FIG. 3 the migration steps can be viewed as receiving data communicated from region A and the synchronization step can be seen as receiving and setting up the state data in step S120. Both these steps overlap with execution of the computer program in region A.

Between communication of partition data and communication of the state data a map to determine where data sent is calculated. This is the underlying ground why there may be two distinct phases of communication.

The idea of the synchronization step is to ensure that the contents of memory on the old and new systems are consistent. Since computation continues on the old system while initializing the new one, it is necessary to synchronies at the appropriate time (not just send state data at the same time as partition data). Equally, execution does not begin on the new system while still running on the old (unless for synchronization purposes as explained later). This would duplicate computation work.

It can be seen that (since the data to be communicated is the same and there is no need to write to or read from disk), the time taken using the proposed improvements can be no more (and is likely to be less) than using the current state-of-the-art. Since computation in region A can continue while synchronization with the new resources is ongoing, the saving is equivalent to the "dead" time (P) that would otherwise be spent on writing the checkpoint files to disk, reading them back and setting up the new domain.

Figure 4:
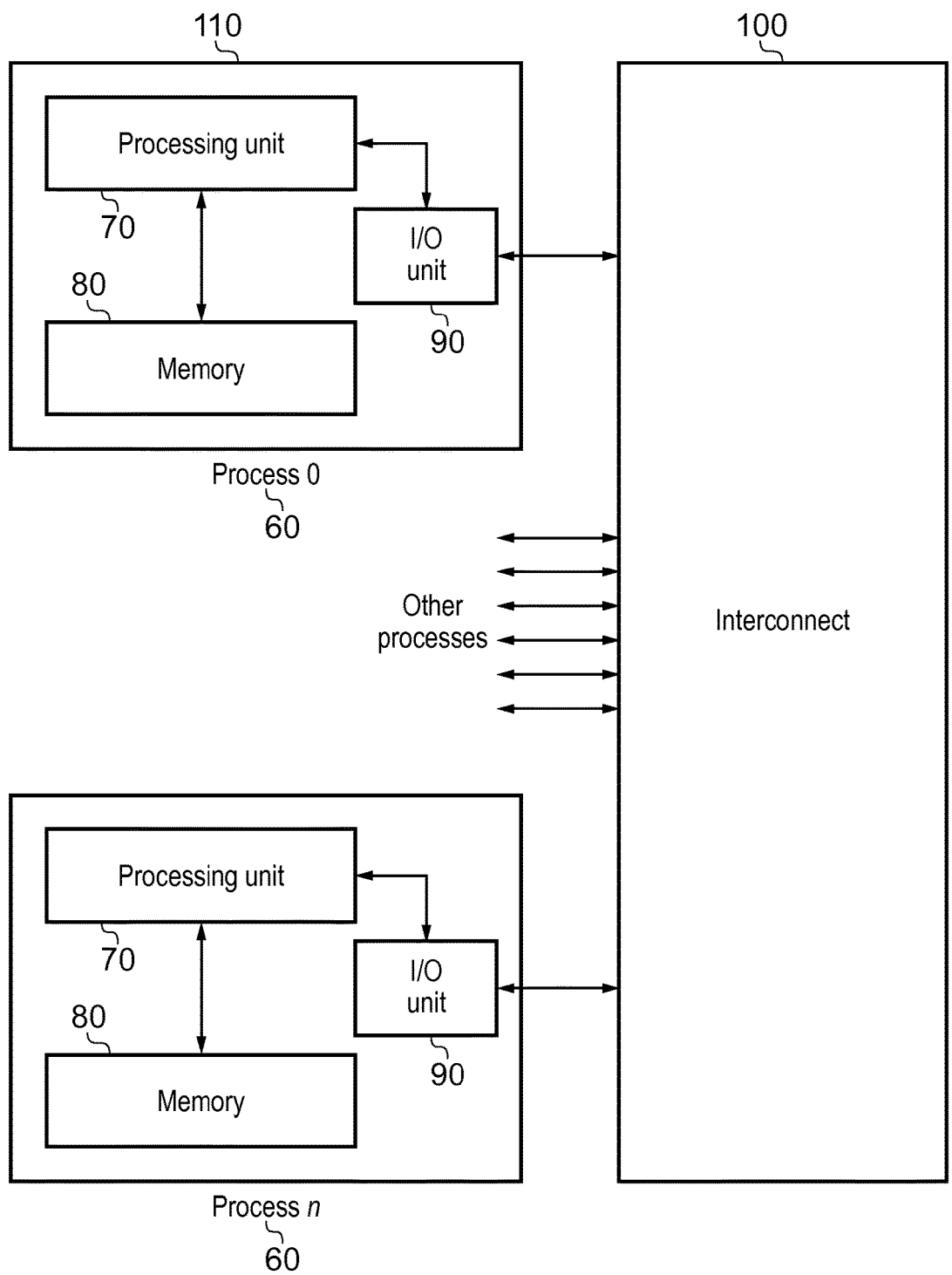
FIG. 4 is a schematic hardware diagram of distributed execution of a computer program.

FIG. 4 shows a schematic diagram illustrating n+1 processes, of which two processes (60), referred to specifically as Process 0 and Process n are shown. Each process uses individual resources including a single processing unit or element (70) and memory (80). The processing unit (70) is connected to an input/output unit (90) and all the processes are interconnected using interconnect (100).

In one specific embodiment, each process is a thread of work that takes place in a single resource block as shown. Each process "owns" at least one computation and may own several linked computations. For example in the case of a simulation, the process can include computation for several adjacent mesh nodes. It can be advantageous to group computations for adjacent mesh nodes in this way because data from adjacent nodes is usually required for the computation for a node in question.

Nodes are re-allocated between processes in repartitioning. A simple example of repartitioning is explained below.

Assume a one dimensional problem with a mesh containing 101 nodes uniformly spaced on the interval $0\leq x\leq 1$ (i.e. each node is 0.01 from its nearest neighbours). The nodes are numbered sequentially from node 0 at x=0 to node 101 at x=1. The problem is initially run on two processing units. The mesh is initially split so that process 0 is responsible for ("owns") all nodes in the region $0\leq x\leq 0.5$ and process 1 owns all nodes in the region $0.5<x\leq 1$. So, process 0 keeps in memory information about the values of variables at nodes 0 to 50 and process 1 keeps in memory information about the values of variables at nodes 51 to 101. For convenience, process 0 also keeps in memory a copy of the information about the values of variables at ("halo owns") node 51 and process 1 halo owns node 50. This is because these nodes are nearest neighbours to a node that is owned by the process and the data is likely to be required to update the data at these owned nodes.

Now suppose that the simulation is to be migrated to run on three processes. The repartitioning step determines which parts of the mesh will be owned by each of the new processes. So, the new process 0 (which may or may not be on the same processor as the old process 0) may be responsible for the region $0\leq x\leq 0.33$ (i.e. nodes 0-33) and halo own node 34; the new process 1 may be responsible for $0.33<x\leq 0.67$ (i.e. nodes 34-67) and halo own nodes 33 and 68; and the new process 2 may be responsible for $0.67<x\leq 1$ (i.e. nodes 68-101) and halo own node 67.

The new partition creates more halo owned nodes as it spreads out computation across more processes. However spreading out the processes allows use of larger resources for the same computations. Before repartitioning, the maximum number of processing units was two, which becomes three due to the repartitioning.

As a result of this repartitioning, the old process 0 must send the data for nodes 0-34 to the new process 0 and the data for nodes 33-50 to the new process 1; and the old process 1 must send the data for nodes 51-68 to the new process 1 and the data for nodes 67-101 to the new process 2.

The following examples provide more detailed workflows overlapping computation and communication for the three cases of increase in resources, decrease in resources and simple migration of resources.

Figure 5:
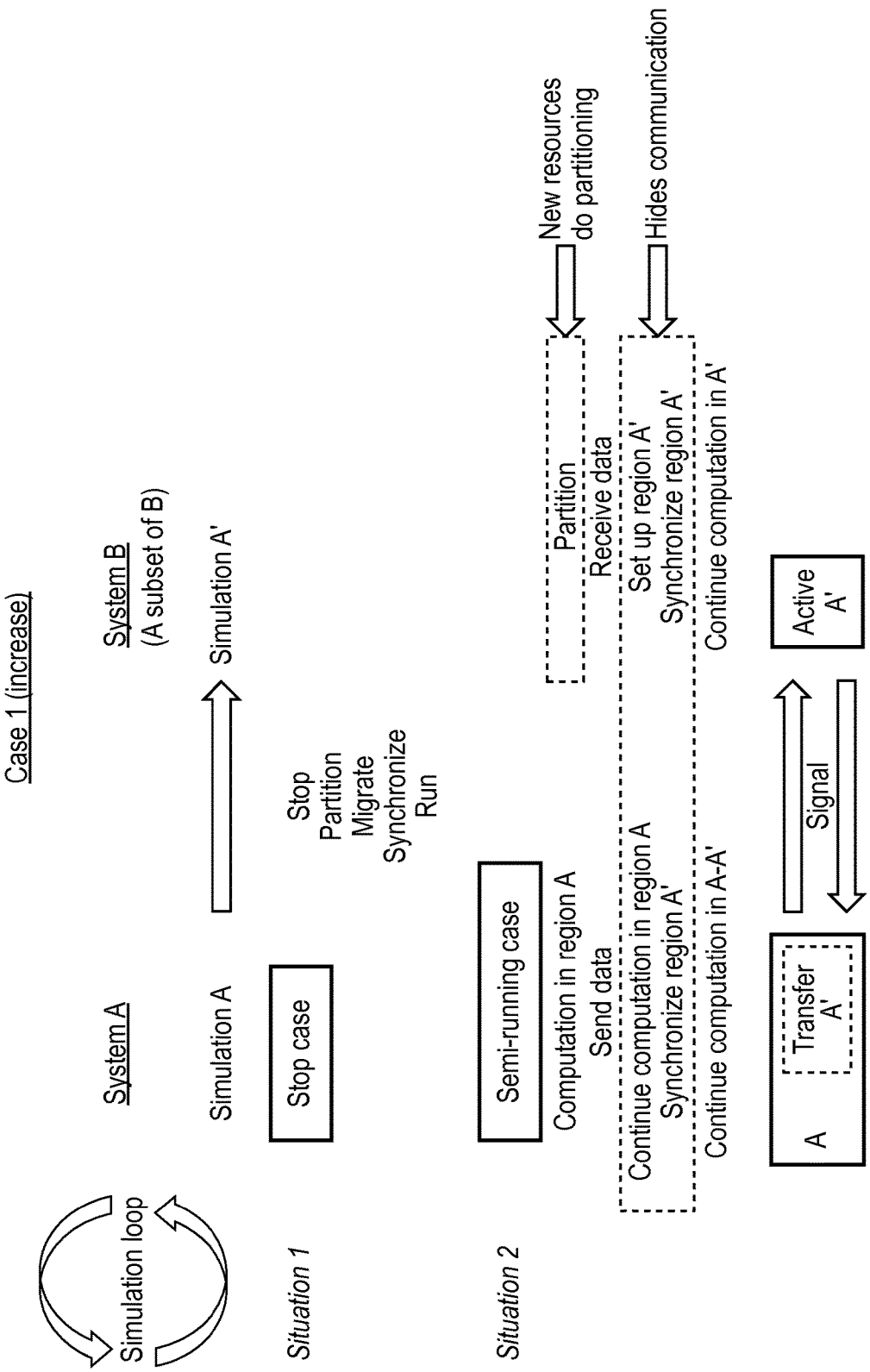
FIG. 5 is an overview comparing migration for increased computing resources in the prior art and according to an invention embodiment.
Figure 6:
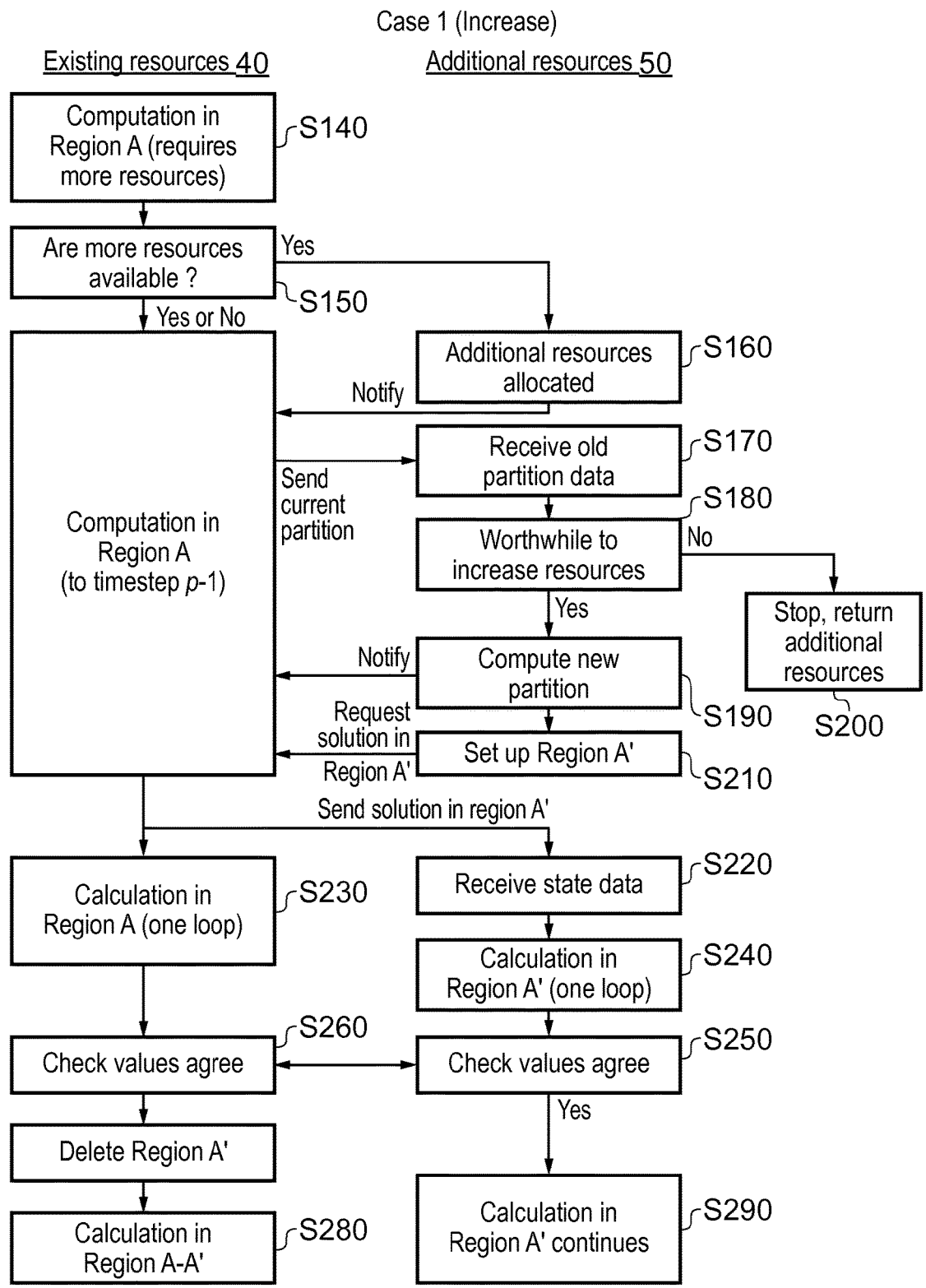
FIG. 6 is a time view of increasing computer resources according to an invention embodiment.

FIGS. 5 and 6 illustrate an increase in resources. FIG. 5 shows an overview of the transfer of simulation A from system A to system B. System B may be a sub-set of system A. Simulation A becomes simulation A' when is run on system B.

In the first situation corresponding to the prior art there is a complete stop to allow migration and synchronisation. After the simulation has stopped there are partition and migration procedures followed by synchronisation and then the simulation A' is run on system B.

Situation 2 corresponds to an invention embodiment and is referred to as a semi-running case. The figure shows procedures in system A and in system B. Initially in system A there is calculation in region A (and communication of region A partition data to system B, which is not shown here)

and then data is sent to system B. In system B the new resources do the new partitioning using the old partition data and then receive the data.

Subsequently, computation is continued in region A while region A' is set up. Synchronisation between regions A and A' is carried out in both systems. Finally computation is continued in A minus A' on system A and A' takes place on system B. That is, some computation in system A continues but some is transferred to system B and in system B, simulation A' takes place. Thus the signalling depicted at the bottom of the figure transfers A' from system A to system B.

FIG. 6 is a more detailed flow diagram showing an embodiment of invention in which resources are increased from existing resources 40 to include additional resources 50. Calculation in region A is ongoing in step S140 but requires more resources and thus the question as to whether more resources are available is asked in step S150. In step S160 additional resources (50) are allocated and this is notified to the existing resources. The existing resources send the current partition to the additional resources which receives this data in step S170. If the additional resources calculate that it is worthwhile to increase resources in step S180 they are increased by calculating the new partition in step S190, otherwise the migration process stops and the additional resources are freed in step S200. Completion of the new partition is notified to the existing resources. In step S210 Region A' is set up and a request is sent to the existing resources for a solution (in the form of state data) in region A'.

The solution is sent to the additional resources in the form of state data which is received in step S220. Meanwhile computation in one loop in Region A continues in the existing resources in step S230. The same computation is carried out in additional resources in step S240 and in step S250 and S260 there is a check that the values agree in the additional and existing resources. Region A' is deleted in step S270 from the existing resources as the part for transfer to the additional resources and in step S280 calculation in the Region A minus A' continues. Correspondingly, calculation in Region A' continues in the additional resources at the same time in step S290.

Figure 7:
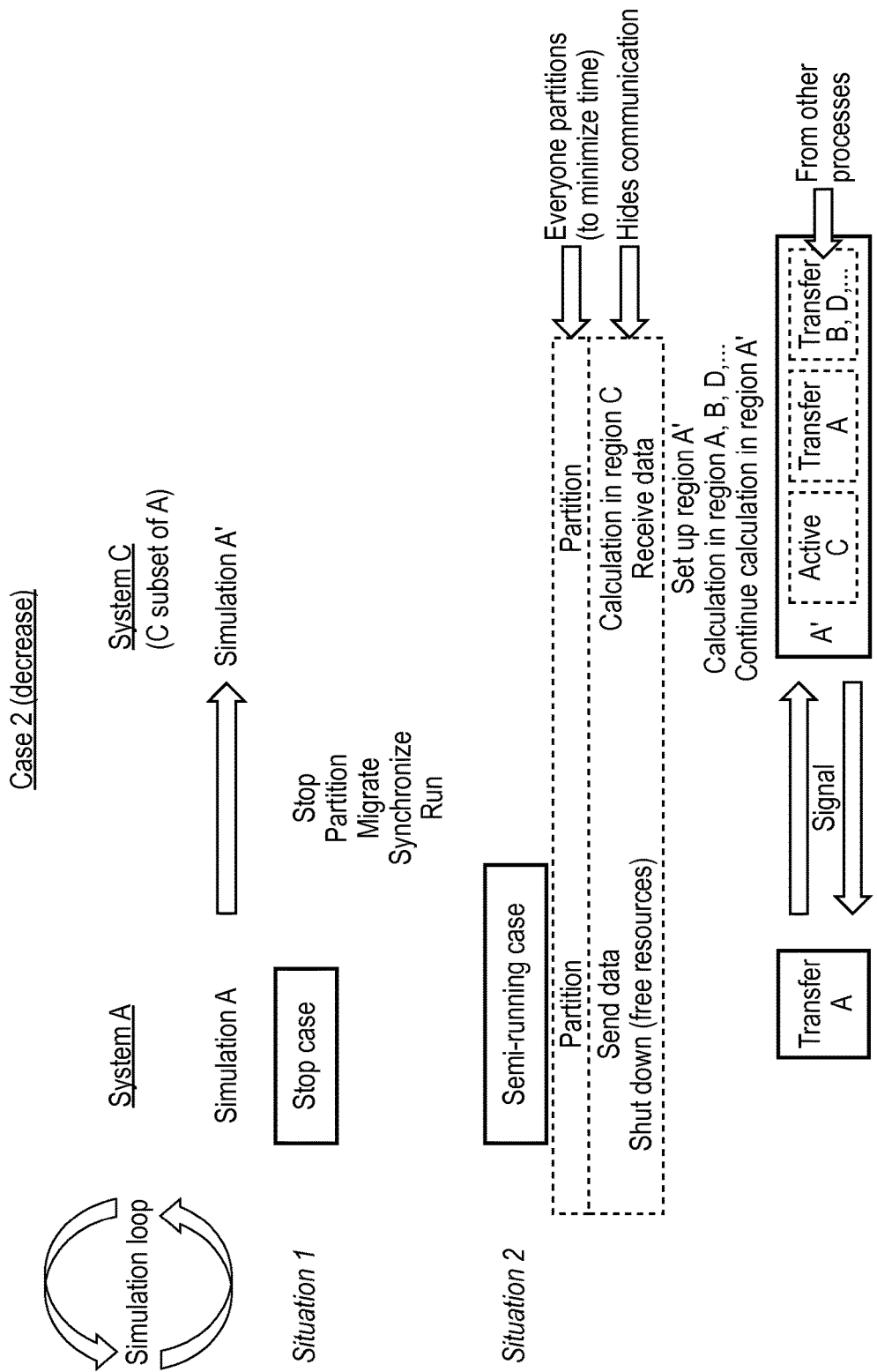
FIG. 7 is an overview comparing migration for decreased computing resources in the prior art and according to an invention embodiment.
Figure 8:
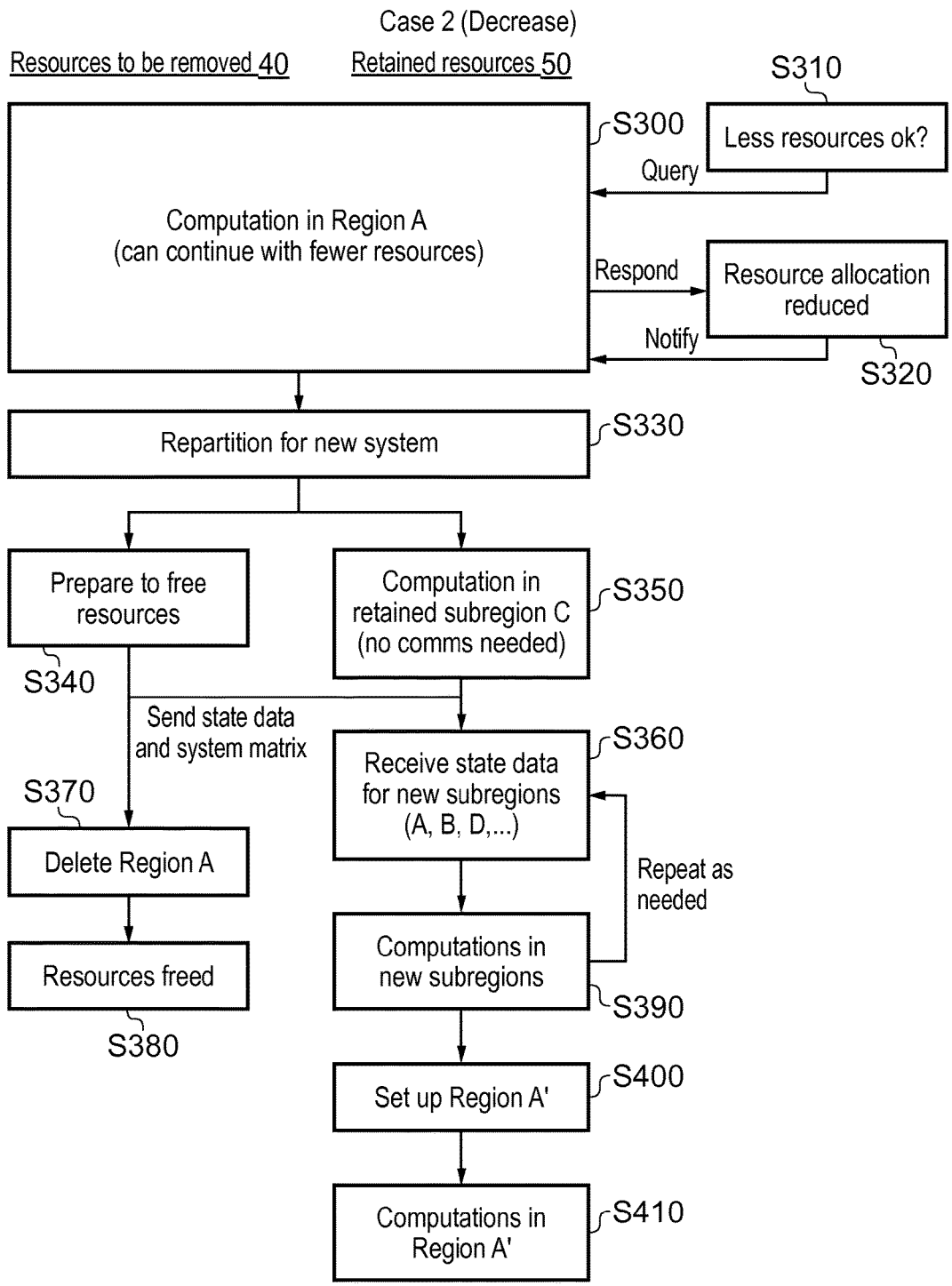
FIG. 8 is a time view of decreasing computer resources according to an invention embodiment.

FIGS. 7 and 8 represent embodiments in which the resource required lowers. The prior art situation 1 shown in FIG. 7 corresponds to that in FIG. 5 except that new system C is possibly a sub-set of A, the original resources.

In situation 2 of FIG. 7 corresponding to an invention embodiment there is a semi-running case in contrast to the stop case of situation 1 of the prior art. In this embodiment partitioning is carried out in both system A and system C. Computation in region C (being a sub-set of region A) continues while data is sent from system A which hides the communication time. Then the resources to be freed of system A, are shut down and Region C receives the data.

Subsequently all the processing from system A is carried out in system C. Region A' is set up and there is calculation in Region A' which is a combination of processing from Regions A, B, D etc. Thus the signalling transfer shown as an overview at the bottom of the figure moves simulation A to A' which amalgamates all of the processing from system A with other processes from elsewhere.

Turning to the more detailed depiction of events according to a resource-decreasing embodiment in FIG. 8, the first step is computation in Region A which is to continue with fewer resources in step S300. Thus Region A includes resources to be removed 40 and retained resources 50. An external query in step S310 may check if it is appropriate to continue with fewer resources and response from Region A may allow the allocation to be reduced in step S320. In step S330 there is repartition for the new system. In the resources to be removed 40 there is preparation to free the resources and sending of data in step S340 which takes place while computation in a retained sub-region C is continued. State data is sent including a system matrix if necessary from the resources to be removed 40 to the retained resources 50. In the case of a simulation often the requirement is effectively to solve a linear system of equations $Ax=b$. In this case the matrix A will be partitioned over the distributed memory and it is necessary to migrate it.

The retained resources receive the state data for new sub-regions (A, B, D) in step S360. In the meantime Region A is deleted in step S370 and the resources to be removed are freed in step S380.

In the retained resources 50 computations in the new sub-regions take place in S390 and there may be a repeat of S360 to receive state data for other new sub-regions. Region A' is finally set up in step S400 and calculation in Region A' takes place in step S410.

Figure 9:
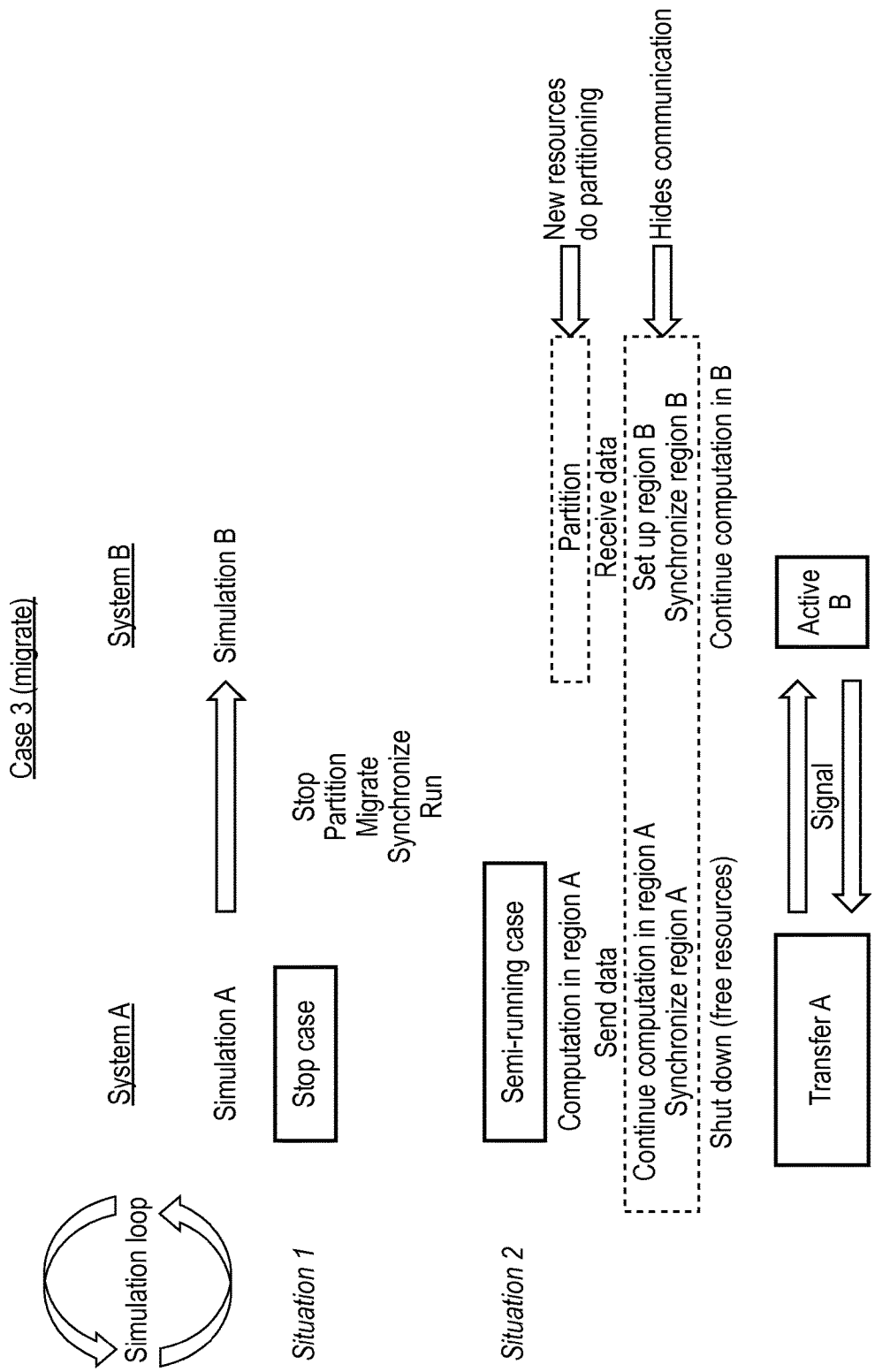
FIG. 9 is an overview comparing migration for changing to new computing resources in the prior art and according to an invention embodiment.
Figure 10:
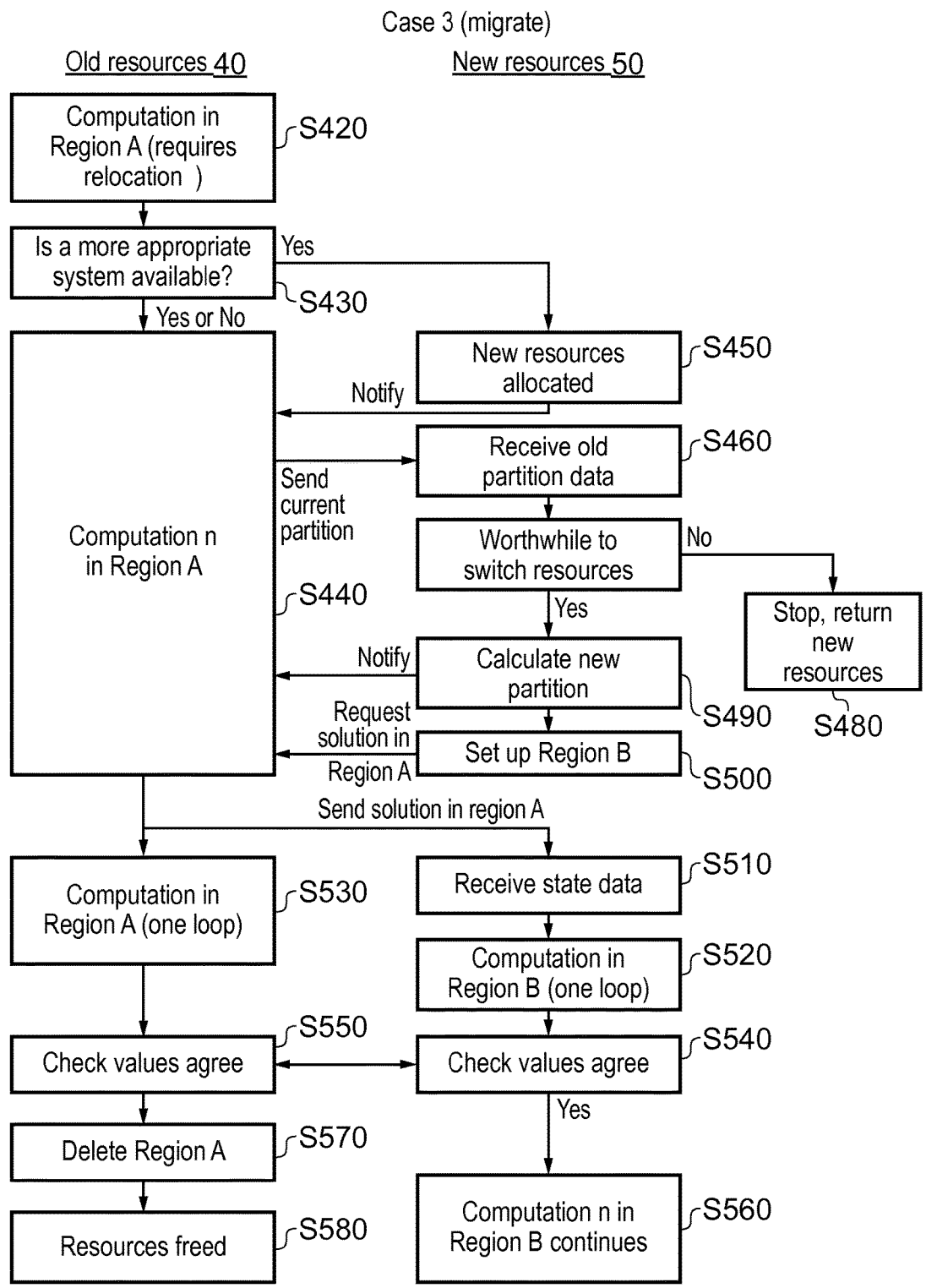
FIG. 10 is a time view of migrating computer resources to a new system.

FIGS. 9 and 10 illustrate the scenario in which there is a migration between systems. That is, system B and system A may not overlap. Situation 1 of FIG. 9 refers to the prior art and thus is not further described.

Situation 2 is another view of an invention embodiment in a semi-running case. Computation in Region A of system A is carried out at the same time as partitioning in the system B. Subsequently the partition data from system A is sent to system B. Calculation is continued in Region A while Region B is set up and then the two regions are synchronised. Finally, the resources in system A are freed and calculation in Region B is continued.

In this scenario there is a transfer between system and A and active system B with two-way signalling.

The migration case is described for a more detailed embodiment in FIG. 10. Initially in step S420 computation takes place in Region A and requires relocation. In step S430 there is a question as to whether a more appropriate system is available. Calculation continues in Region A anyway in step S440 but if new resources 50 are available then the system B allocates these new resources in step S450 and notifies system A. The current partition is sent from the system A to system B and received in system B in step S460. In step S470 the question is asked whether it is worthwhile to switch resources given this data and if it is not worthwhile in step S480 the migration process is stopped and the new resources are freed. Conversely if it is worthwhile to switch resources a new partition is computed in step S490. System B notifies system A, sets up Region B in step S500 and then requests the solution in Region A (that is, the state data allocation). The new system receives this state data in step S510 and calculates one loop in step S520. Meanwhile system A calculates the same loop in step S530. In steps S540 and S550 there is a check as to whether these values agree if so calculation in Region B continues in step S560. Region A is deleted in step S570 and the resource is freed in step S580.

Some advantageous features of invention embodiments are:

a) The flexibility that embodiments give to move executions to any different system (larger, smaller or the same size). It is highly advantageous that the invention embodiments have the option to implement all three of these cases.

b) The on-the-fly nature of the migration for a distributed memory system (i.e. the execution does not need to be stopped, moved and then re-started on the new system).

c) The ability to increase the number of processes (more recent prior art for fault-tolerance consider on-the-fly methods to deal with a reduction in the number of processes, but not an increase).

d) The controlled nature of the change. In fault-tolerant applications the system copes with an uncontrolled loss of resources. The invention embodiments allow the user to specify exactly how many processes the execution should run on.

e) The scale of the change in resources—i.e. for fault-tolerance usually only a small number of nodes will fail at any one time, so the idea is to deal with a small reduction in resources. In this invention there is capability to make a very large reduction in resources—may be from thousands of nodes to a single one, due to the migration and synchronization procedure.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A process migration method to migrate a simulation, comprising
   executing a computer program using a group of parallel processes, each parallel process carrying out at least one computation in the simulation, and an execution using current computing resources to provide current group data as a result of all computations,
   deciding to change the current computing resources used for executing the computer program, and making a choice between increasing an overall amount of resources used for executing the computer program, decreasing the amount of resources used for executing the computer program, and moving to different resources, wherein moving to different resources includes one of an increase, a decrease and a maintenance of the overall amount of resources used for executing the computer program; and
   communicating between the current computing resources and changed computing resources to allow the computer program to execute on the changed computing resources, the communicating comprising migration of the execution to the changed computing resources and synchronization of migrated group data with the current group data;
   wherein the execution using the current computing resources overlaps in time with the communicating;
   wherein migration includes communication of partition data from the current resources to the changed computing resources, the partition data indicating a current allocation of computations to processes and migration includes repartitioning of the current allocation of computations to processes for the changed computing resources to create new partition data; and
   wherein each process uses individual current resources including a single processing unit executing the at least one computation and a single region of memory to store current process data for the at least one computation.

2. A process migration method according to claim 1, wherein the execution continues on the changed computing resources after the communicating.

3. A process migration method according to claim 1, wherein a processing unit used is one of a node, a processor and a core of a multi-core processor in a distributed memory computing system.

4. A process migration method according to claim 3, wherein new partition data indicating a changed allocation of computations to processes is calculated and wherein a mapping of processes to changed resources is made.

5. A process migration method according to claim 4, wherein synchronization includes communication of state data relating to migrated computations, the communication taking place between the current resources and the changed resources.

6. A process migration method according to claim 5, wherein an equation solver runs the computations and the synchronization is either one of embedded within the equation solver and in a form of a wrapper for the equation solver.

7. A process migration method according to claim 1, wherein the computations are iterations of an equation solver running in a loop, and wherein synchronization is carried out at an end of one loop and preferably includes running computations for a next loop in both the current computing resources and the changed computing resources, with comparison of results.

8. A process migration method according to claim 1, wherein the computation is an iterative computation providing data for a single element in the computer program, and wherein the computer program is preferably a simulation program, a single element corresponding to one of a collection of mesh nodes of a mesh simulation, at least one agent of an agent simulation and at least one particle of a particle simulation.

9. A process migration method according to claim 1, wherein an entire group of processes is migrated from one computer system to another computer system, and synchronization is between migrated group data and all of current group data.

10. A process migration method according to claim 8, wherein migration one of increases and decreases a number of processes by altering a number of elements.

11. A process migration method according to claim 9, wherein migration one of increases and decreases a number of processes by altering one of a number of computations and a division of computations into processes, a selection between increasing and decreasing the number of processes being made according to whether computing resource requirements of the computer program have increased or decreased.

12. A process migration method according to claim 11, wherein a user specifies the number of processes on which the computer program runs.

13. A computer system operable to carry out process migration for a simulation, comprising:
   distributed processing and memory configured to execute a computer program in a group of parallel processes, each parallel process carrying out a computation of the simulation using current processing units and associated current memory, wherein the execution of the computer program uses the current processing units and associated current memory to provide current group data as a result of all computations;
   a controller configured to decide whether to change the current processing units used for executing the computer program, and to make a choice between increasing an overall amount of resources used for executing the computer program, decreasing the overall amount of resources used for executing the computer program and moving to different processing units, wherein moving to different processing units includes one of an increase, a decrease and a maintenance of the overall amount of resources used; and an interconnect configured to provide communication of partition data indicating a current allocation of computations to processes between the current processing units and associated current memory and changed processing units and associated changed memory to allow the computer program to execute on the changed processing units and associated changed memory, the communication comprising migration of the execution of the computer program to the changed processing units and associated changed memory and synchronization of migrated group data with the current group data;

wherein the interconnect is configured for communication in a time span that overlaps with execution of the computer program using the current processing units and associated current memory region;

wherein each process uses individual current resources including a single processing unit executing the at least one computation and a single region of memory to store current process data for the at least one computation; and wherein the migration includes repartitioning of the current allocation of computations to processes for the changed computing resources to create new partition data.

14. A non-transitory computer-readable storage medium storing a computer program which when loaded onto a distributed memory computer system configures the computer system to carry out a process migration method for a simulation, the method comprising executing a computer program using a group of parallel processes, each parallel process carrying out at least one computation of the simulation, and an execution using current computing resources to provide current group data as a result of all computations;

deciding to change the current processing units used for executing the computer program, and making a choice between increasing an overall amount of resources used for executing the computer program, decreasing the overall amount of resources used for executing the computer program and moving to different processing units, wherein moving to different processing units includes one of an increase, a decrease and a maintenance of the overall amount of resources used for executing the computer program; and communicating between the current computing resources and changed computing resources to allow the computer program to execute on the changed computing resources, the communicating comprising migration of the execution to changed computing resources and synchronization of migrated group data with the current group data;

wherein execution using the current computing resources overlaps in time with the communicating;

wherein migration includes communication of partition data from the current resources to the changed resources, the partition data indicating a current allocation of computations to processes;

wherein each process uses individual current resources including a single processing unit executing the at least one computation and a single region of memory to store current process data for the at least one computation; and wherein migration includes repartitioning of the current allocation of computations to processes for the changed computing resources to create new partition data.

* * * * *